US007497697B2

(12) United States Patent
Hoshino et al.

(10) Patent No.: US 7,497,697 B2
(45) Date of Patent: Mar. 3, 2009

(54) PCB CONNECTOR INCLUDING PLUG AND SOCKET CONTACTS FOR EASY POSITIONING

(75) Inventors: Hirokazu Hoshino, Tokorozawa (JP); Naoyuki Kimura, Fuchu (JP); Yusuke Shimura, Kawasaki (JP)

(73) Assignee: OMRON Corporation, Kyoto (JP)

( * ) Notice: Subject to any disclaimer, the term of this patent is extended or adjusted under 35 U.S.C. 154(b) by 0 days.

(21) Appl. No.: 11/862,022

(22) Filed: Sep. 26, 2007

(65) Prior Publication Data

US 2008/0081506 A1 Apr. 3, 2008

(30) Foreign Application Priority Data

Sep. 29, 2006 (JP) ............................ 2006-266274

(51) Int. Cl.
*H01R 12/00* (2006.01)
*H05K 1/00* (2006.01)

(52) U.S. Cl. ........................................................ 439/74

(58) Field of Classification Search .................. 439/74, 439/75, 66, 65, 83, 81

See application file for complete search history.

(56) References Cited

U.S. PATENT DOCUMENTS

| | | | | |
|---|---|---|---|---|
| 5,928,003 | A * | 7/1999 | Kajinuma | 439/74 |
| 6,623,308 | B2 * | 9/2003 | Ono | 439/680 |
| 7,172,434 | B2 * | 2/2007 | Obikane et al. | 439/74 |
| 7,195,494 | B2 * | 3/2007 | Ookura | 439/74 |
| 7,232,317 | B2 * | 6/2007 | Ookura | 439/74 |
| 7,264,484 | B2 * | 9/2007 | Takano | 439/74 |

FOREIGN PATENT DOCUMENTS

| | | |
|---|---|---|
| CN | 1771630 | 5/2006 |
| JP | 2002-8753 | 1/2002 |
| JP | 2005-203139 A | 7/2005 |
| JP | 2005-294034 | 10/2005 |

OTHER PUBLICATIONS

English abstract of JP2005203139 published Jul. 28, 2005, esp@cenet database, 1 page.
Chinese Office Action for patent application No. 2007101416207, mailed Sep. 5, 2008, and English translation thereof, 9 pages.
English Abstract from esp@cenet for JP 2005294034, Publication Date: Oct. 20, 2005, 1 page.
Korean Office Action for Application No. 10-2007-0072111, mailed Sep. 29, 2008, and English translation thereof, 9 pages.

* cited by examiner

*Primary Examiner*—Javaid Nasri
(74) *Attorney, Agent, or Firm*—Osha • Liang LLP

(57) ABSTRACT

A connector includes a socket in which first contacts are provided parallel to an opening edge portion and a plug which has a flat shape capable of fitting in the opening edge portion of the socket. The plug includes second contacts provided parallel to positions corresponding to the first contacts in the plug. A guide portion is provided in either the opening edge portion of the socket or an outer peripheral edge portion of the plug.

4 Claims, 14 Drawing Sheets

(A)

(B)

FIG. 8A (A)
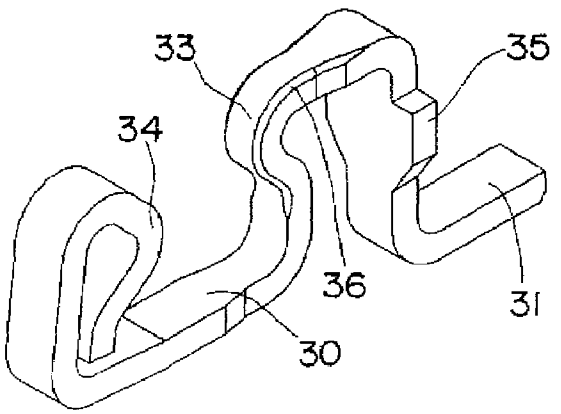
(B) FIG. 8B
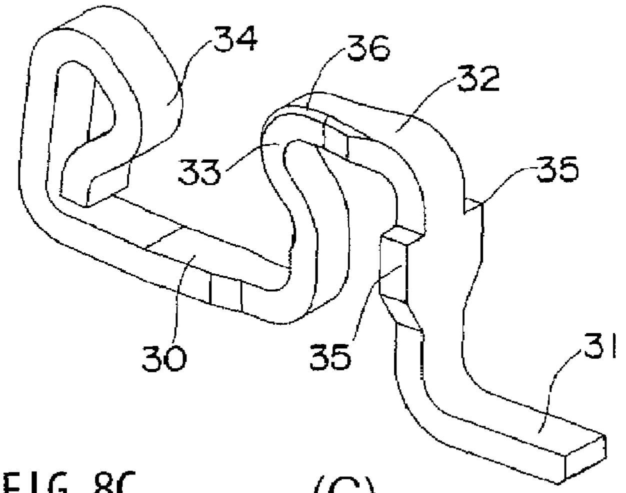
FIG. 8C (C)
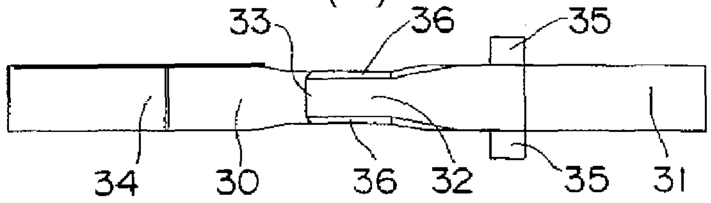
(D)
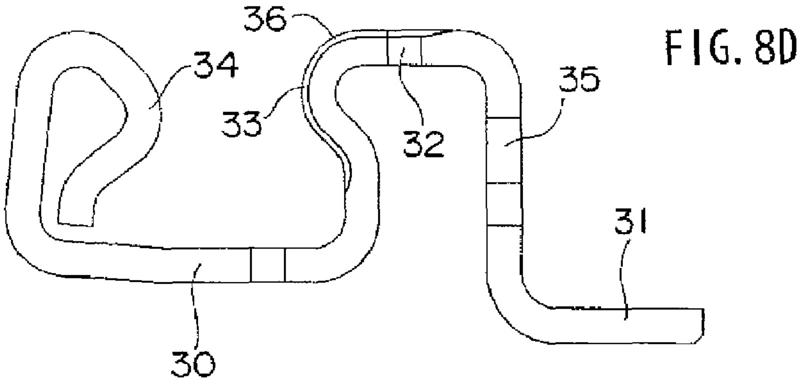
FIG. 8D (B)

PCB CONNECTOR INCLUDING PLUG AND SOCKET CONTACTS FOR EASY POSITIONING

CROSS-REFERENCE TO RELATED APPLICATIONS

This application claims priority, pursuant to 35 U.S.C. §119(e), to the filing date of Japanese Patent Application No. JP 2006-266274, filed on Sep. 29, 2007, which is hereby incorporated in its entirety.

BACKGROUND OF THE INVENTION

1. Field of the Invention

The present invention relates to a connector, particularly to a connector for electrically connecting printed boards to each other.

2. Description of the Related Art

Conventionally, in a connector which connects printed boards to each other, a socket 11 fixedly connected to an upper surface of a circuit board A is fitted in a header 12 fixedly connected to a lower surface of another printed board A, and a contact terminal 14 provided in the socket 11 and a contact terminal 16 provided in the header 12 are connected to each other while being in elastic contact with each other (refer to, for example, Japanese Patent Application Laid-Open No. 2005-203139).

However, in the conventional connector, when the header 12 is positioned and fitted in the socket 11, the connector is not visible because the connector is hidden behind the upper printed board. Therefore, the positioning is not easily performed in the fitting work and a technical skill is required. When the header is forcedly connected to the socket while inaccurately positioned, there arises a problem that a splice of the connector is broken.

SUMMARY OF THE INVENTION

In view of the foregoing, an object of the present invention is to provide a connector, with which connecting work is easily performed with no need of technical skills, productivity is enhanced, and the breakage will not occur.

A connector according to an aspect of the present invention includes a socket in which a plurality of first contacts are provided in parallel in an opening edge portion; and a plug which has a flat shape capable of being fitted in the opening edge portion of the socket, second contacts being provided in parallel at positions corresponding to the first contacts in the plug, wherein a guide portion is provided in at least one of the opening edge portion of the socket and an outer peripheral edge portion of the plug.

According to the aspect of the present invention, fitting is performed through the guide portion formed in at least one of the opening edge portion of the socket and the outer peripheral edge portion of the plug, so that the positioning work can be easily performed, and connecting work can be rapidly and correctly performed. Therefore, the productivity is improved and the breakage accident of the splice can be prevented. Examples of the guide portion include a so-called C-surface and a so-called R-surface.

In the connector according to the aspect of the present invention, a guide portion is preferably provided in at least one of an inside corner portion of a press-in portion of the first splice and a lower edge portion of a press-in groove, the press-in portion of the first splice being formed to stride over the opening edge portion of the socket, the press-in portion being press-fitted and retained in the opening edge portion, the inside corner portion of the press-in portion being able to be slide-fitted in the press-in groove from a lower side, the second splice of the plug being able to be pressed in and retained in the press-in groove. Therefore, because the guide portion is provided in at least one of the inside corner portion of the press-in portion of the first splice and the lower edge portion of the press-in groove of the plug, the positioning accuracy is further improved, so that the connecting work can be facilitated. Accordingly, the connecting work can rapidly and correctly be performed.

In the connector according to the aspect of the present invention, a free end portion of each of the first contacts provided in parallel in the socket is preferably disposed in a fitting groove provided in the opening edge portion of the socket in a elastically deformable manner, and the free end portion is able to be connected to the second splice of the plug.

Even if the component accuracy and assembly accuracy vary in the socket and plug, the free end portion of the first contact is elastically deformed while maintaining the contact state with the second splice. Therefore, the higher component accuracy and assembly accuracy are not required, which facilitates the production and assembly of the connector according to the present invention. Accordingly, there is an advantage that an yield can be improved.

BRIEF DESCRIPTION OF THE DRAWINGS

FIG. 7A shows a perspective view, FIG. 7B shows a perspective view when viewed from a different angle, FIG. 7C shows a plan view, and FIG. 7D shows a front view, respectively;

FIGS. 8A to 8D illustrate a modification of the first contact shown in FIG. 7, where FIG. 8A shows a perspective view, FIG. 8B shows a perspective view when viewed from a different angle, FIG. 8C shows a plan view, and FIG. 8D shows a front view, respectively;

DETAILED DESCRIPTION OF THE PREFERRED EMBODIMENTS

Figure 1A:
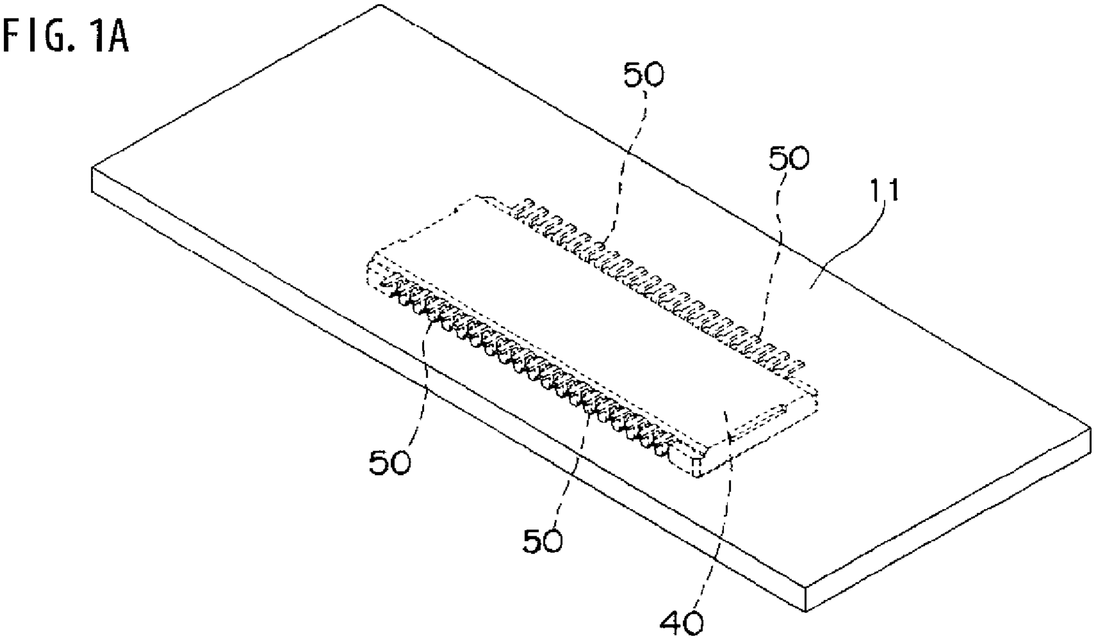
FIGS. 1A and 1B show perspective views of a plug and a socket in use of a connector according to an embodiment of the present invention.
Figure 1B:
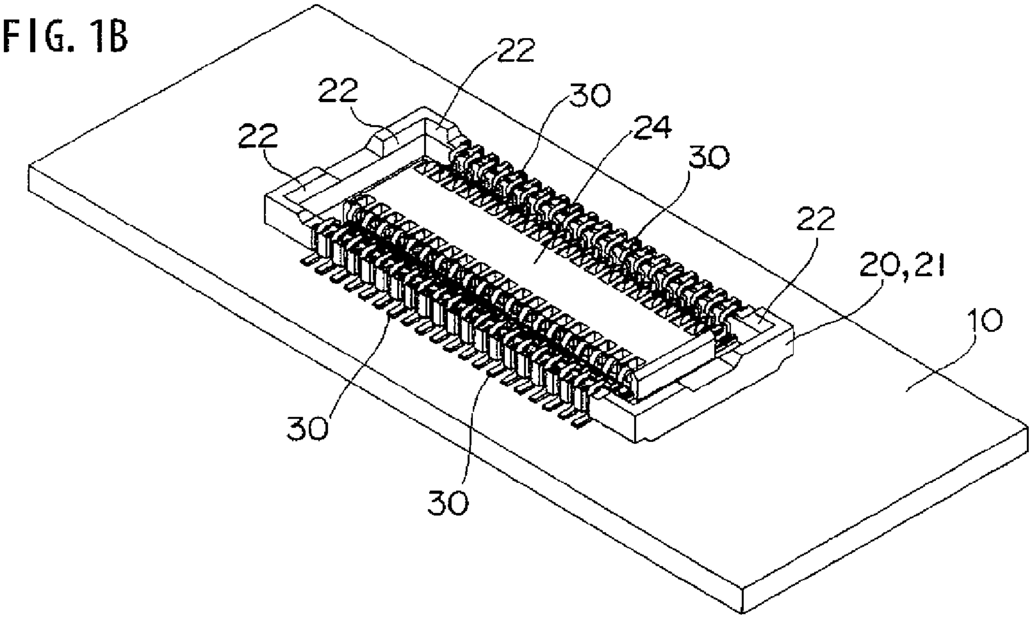
Figure 2A:
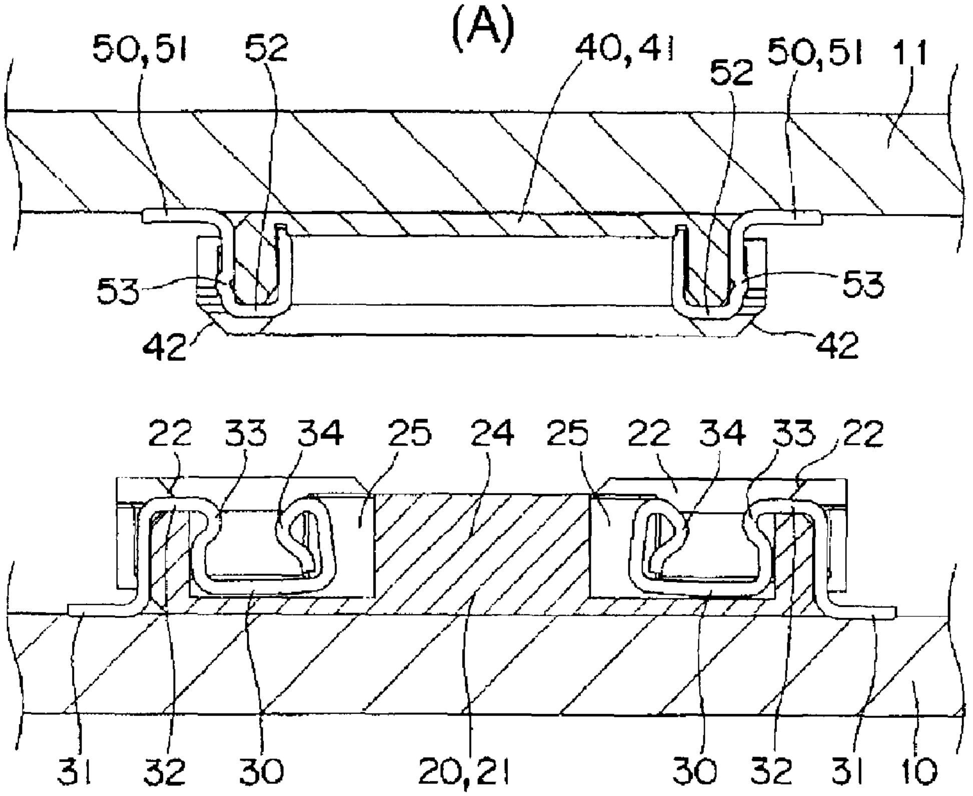
FIGS. 2A and 2B show cross-sectional views illustrating a method of connecting the plug and the socket of the connector according to the embodiment.
Figure 2B:
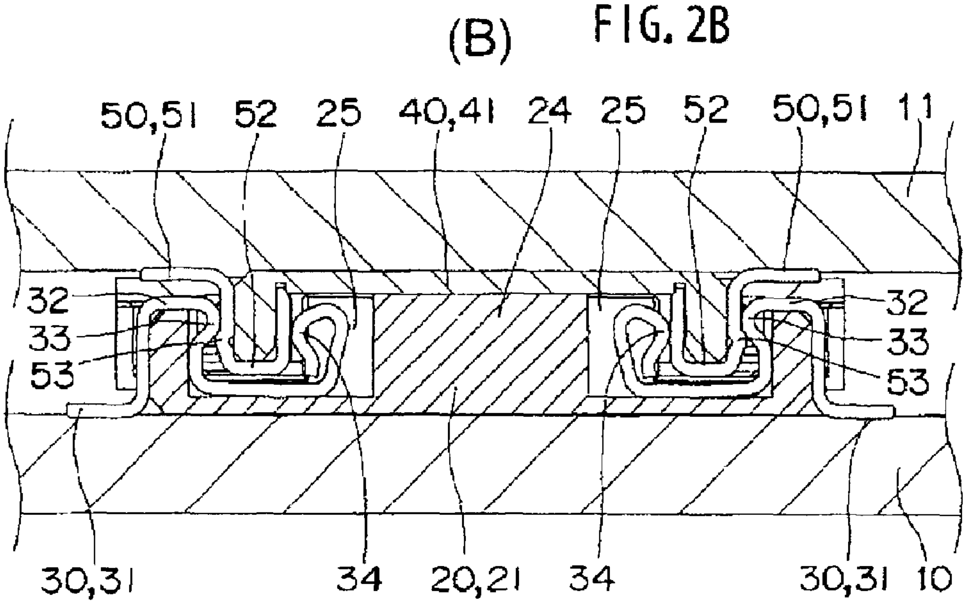
Figure 3A:
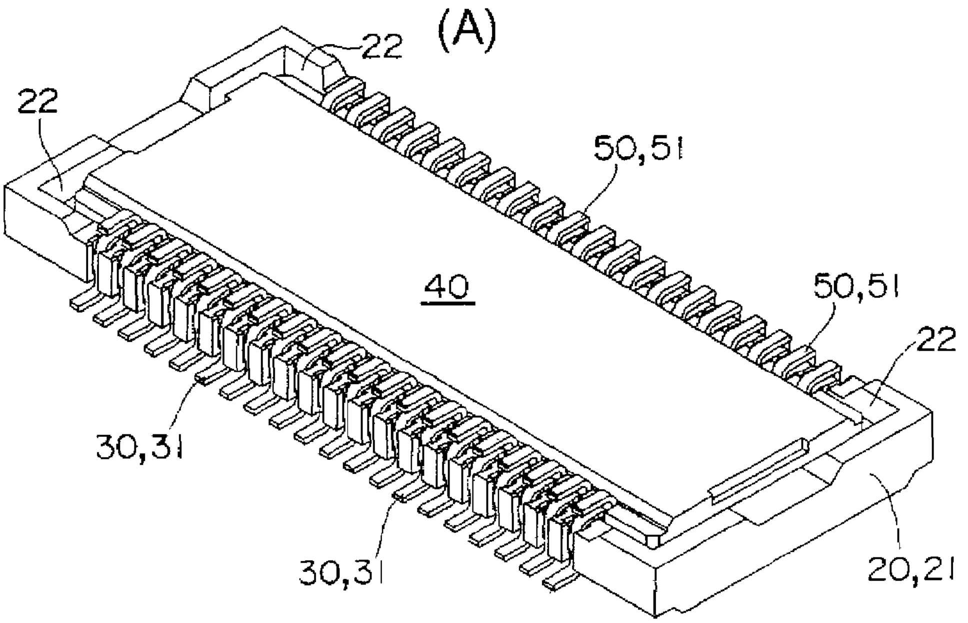
FIGS. 3A and 3B show a perspective view and a partially enlarged plan view of the connector according to the embodiment.
Figure 3B:
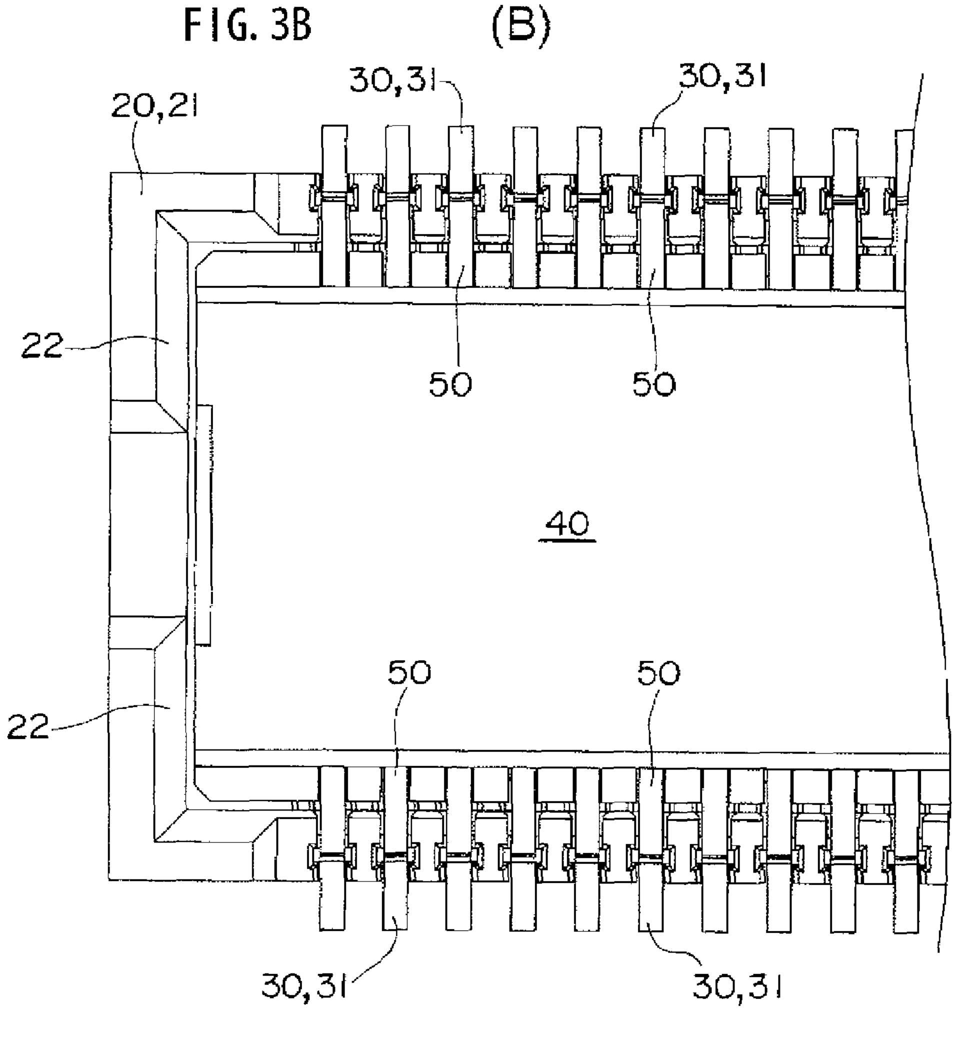
Figure 4A:
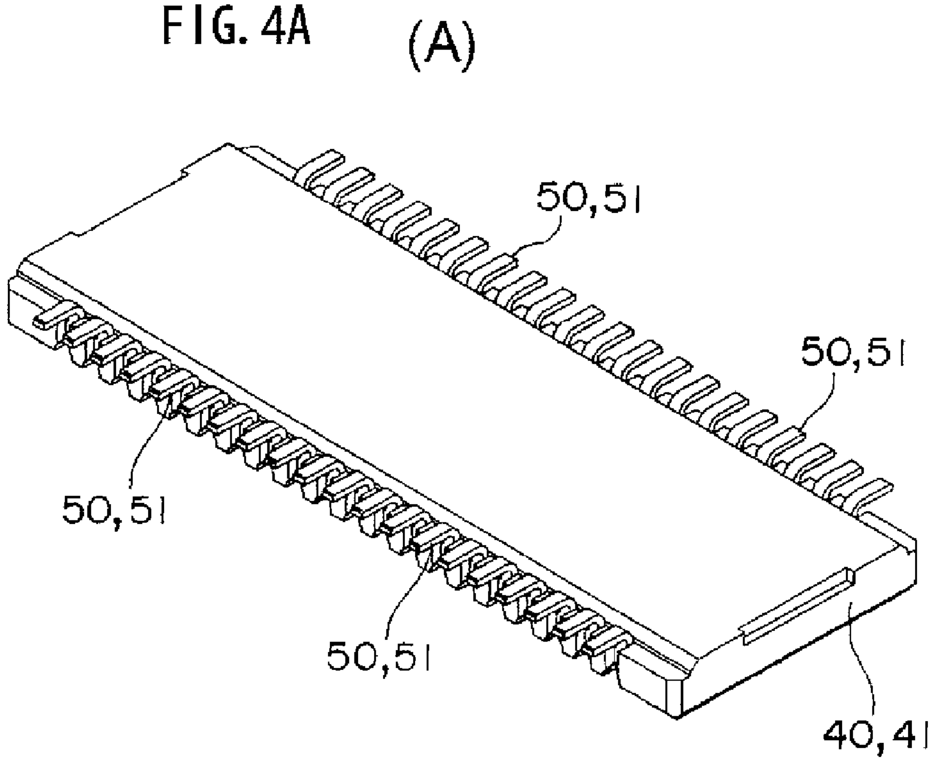
FIG. 4 shows an exploded perspective view of the plug and the socket of the connector shown in FIG. 3.
Figure 4B:
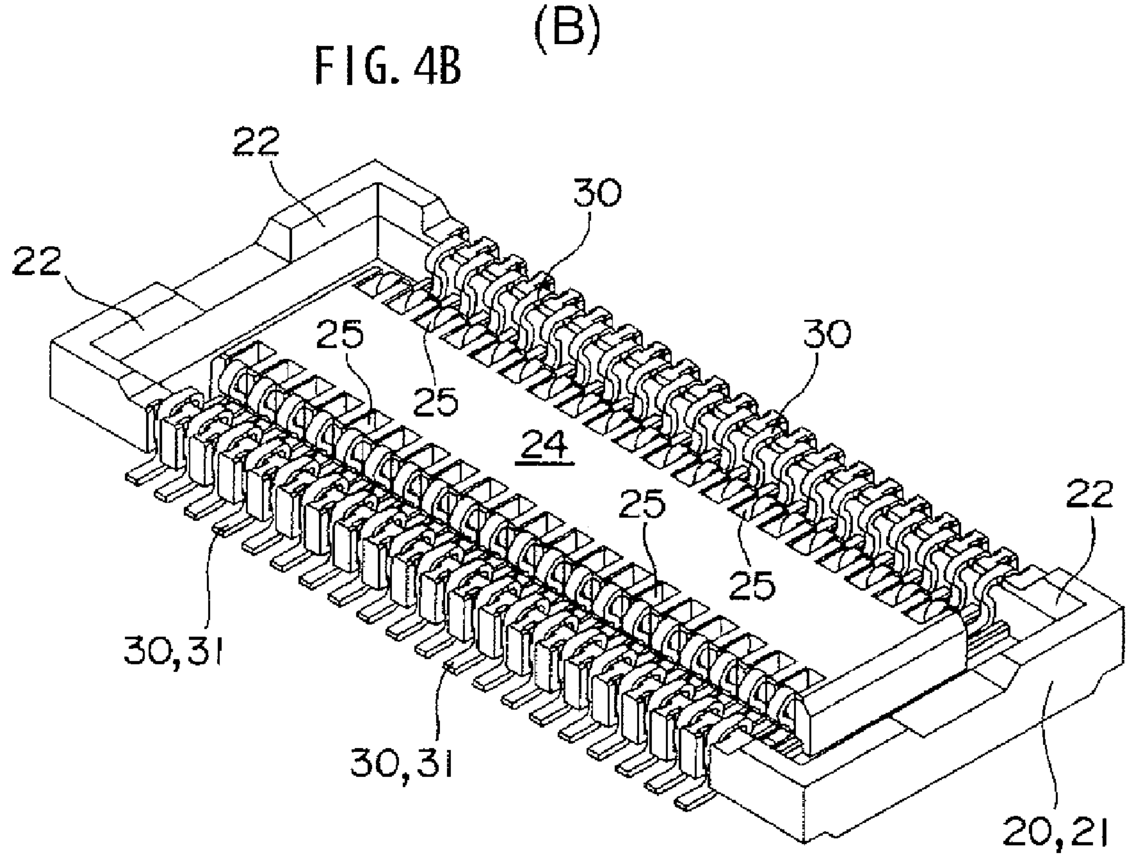

Preferred embodiments of a connector according to the present invention will be described with reference to the accompanying drawings. As shown in FIGS. 1 and 2, the connector according to the present embodiment includes a socket 20 and a plug 40. The socket 20 is coupled to an upper surface of a printed wiring board 10, and the plug 40 is coupled to a lower surface of a printed wiring board 11.

Figure 6A:
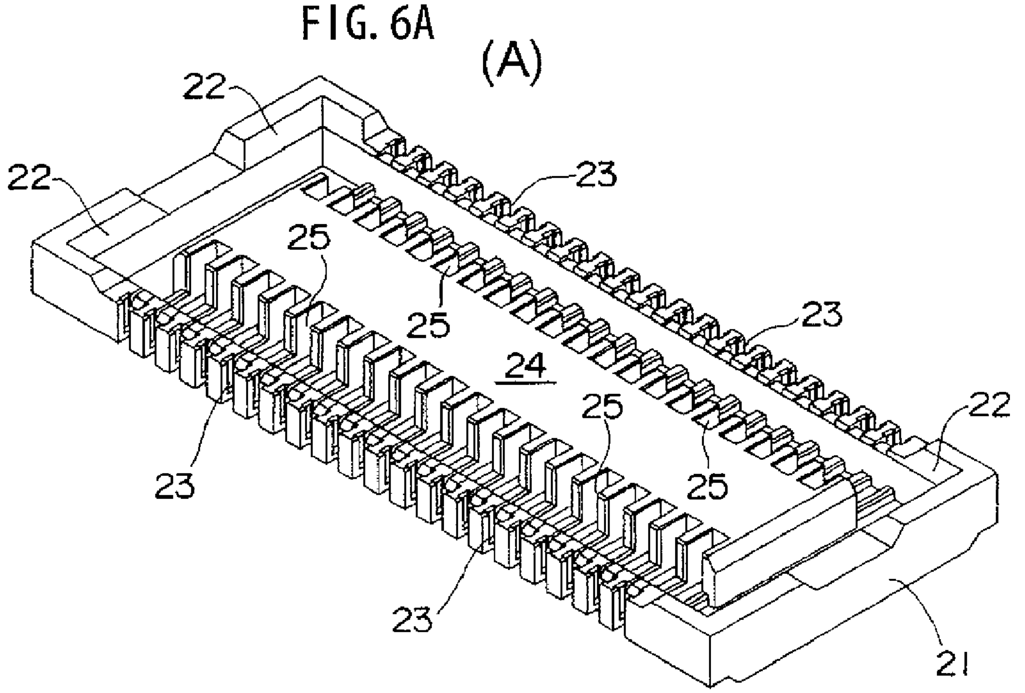
FIGS. 6A and 6B show a perspective view and a partially enlarged plan view of a socket body shown in FIG. 5.
Figure 6B:
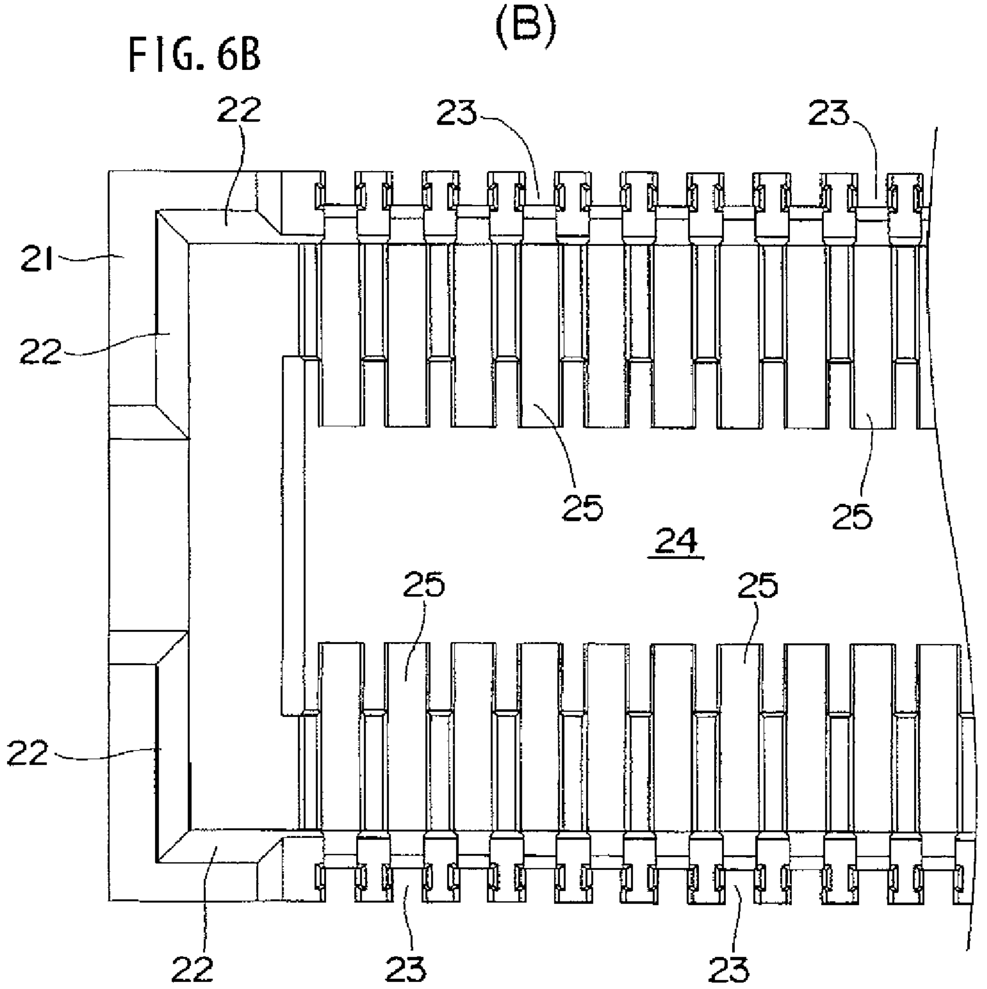
Figure 7A:
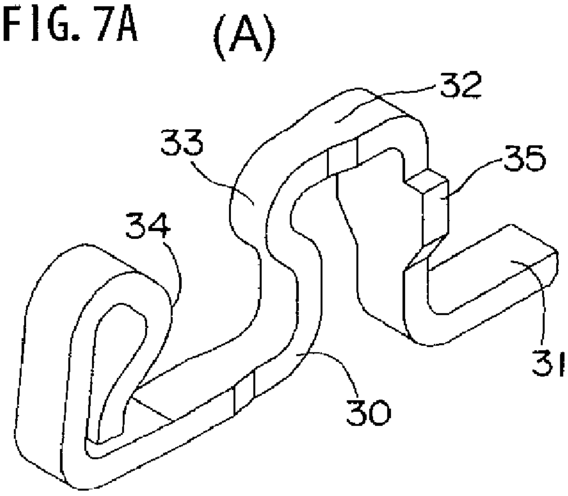
FIGS. 7A to 7D illustrate a first contact shown in FIG. 5, where
Figure 7B:
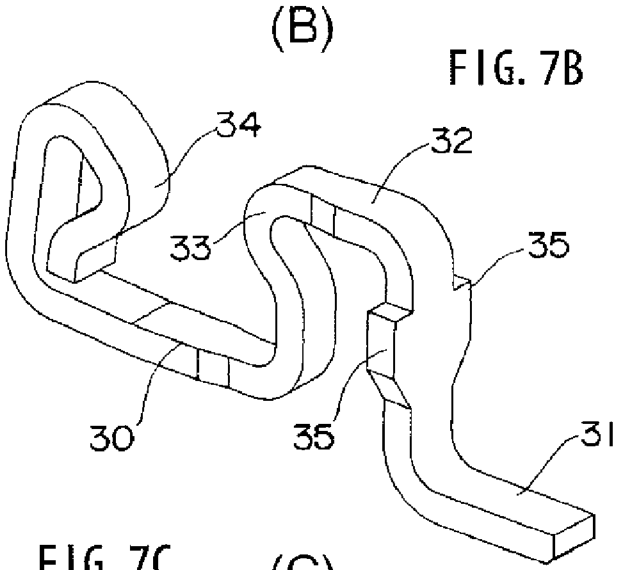
Figure 7C:
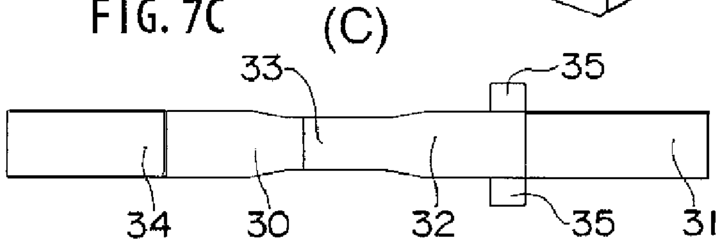
Figure 7D:
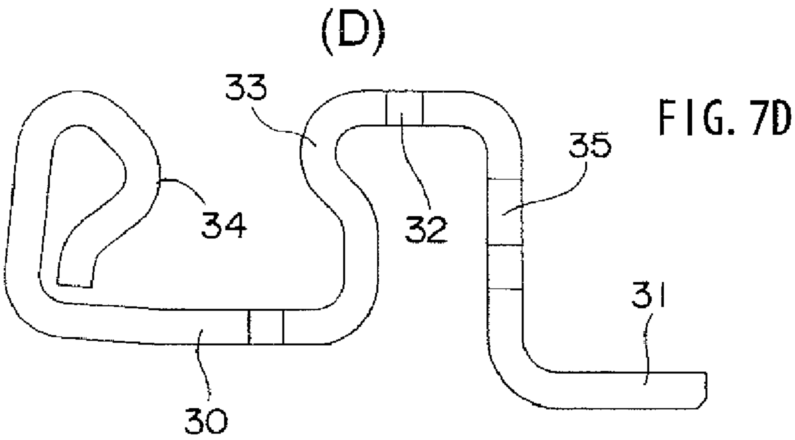

In the socket 20, a plurality of first contacts 30 are provided in parallel along opening edge portions located on opposite sides of a socket body 21. As shown in FIG. 6, the socket body 21 has a box shape with a shallow bottom, a guiding tapered surface 22 is formed in the opening edge portion of the socket body 21, and press-in grooves 23 are provided in parallel at a predetermined pitch along outside surfaces of sidewalls located on opposite sides. First contacts 30 to be described later are press fitted in the press-in grooves 23. In the socket body 21, a base portion 24 having a flat rectangular shape is projected at the center of a bottom surface, and fitting grooves 25 are provided in parallel at positions corresponding to the press-in grooves 23 in the outer peripheral surfaces of the base portion 24. The fitting groove 25 is wider than a second contact portion 34, which will be described later, located in a free end portion of the first contact 30, or alternately the first splice 30. Obviously, the guiding tapered surface 22 may be formed in the R-surface.

As shown in FIG. 7, in the first splice 30, a portion extended from a wire connection portion 31 is vertically bent to form a substantially U-shaped press-in portion 32, and a first contact portion 33 is formed at a corner portion on the free end side of the press-in portion 32. A free end portion extended from the press-in portion 32 is vertically bent and curved to form the second contact portion 34. The second contact portion 34 is projected inward so as to face the first contact portion 33. Retaining protrusions 35 and 35 are formed in edge portions on both sides of a base portion of the press-in portion 32.

Figure 9A:
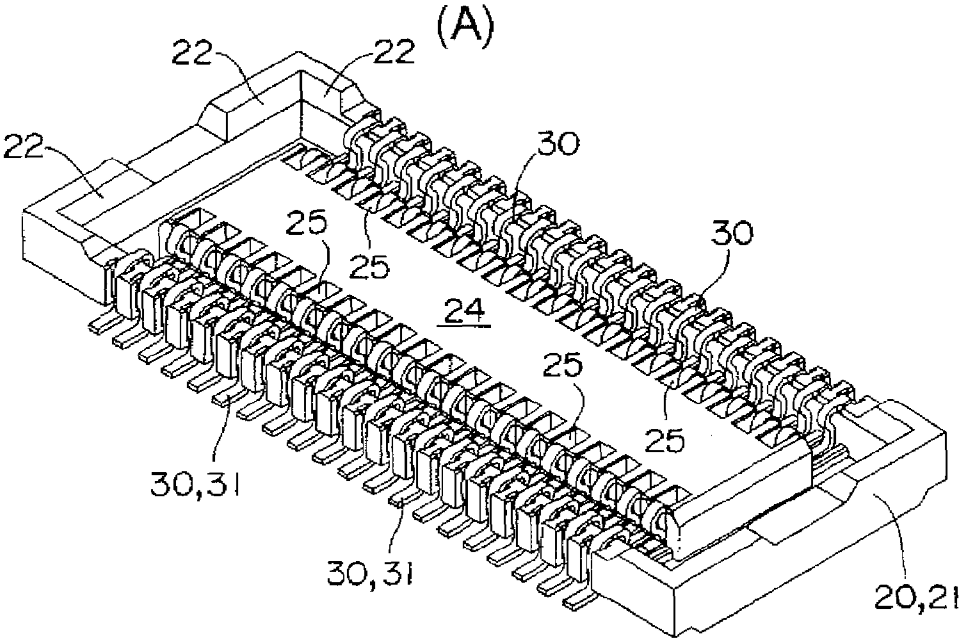
FIGS. 9A and 9B show a perspective view and a partially enlarged plan view illustrating a state in which the first splice is fitted in the socket body.
Figure 9B:
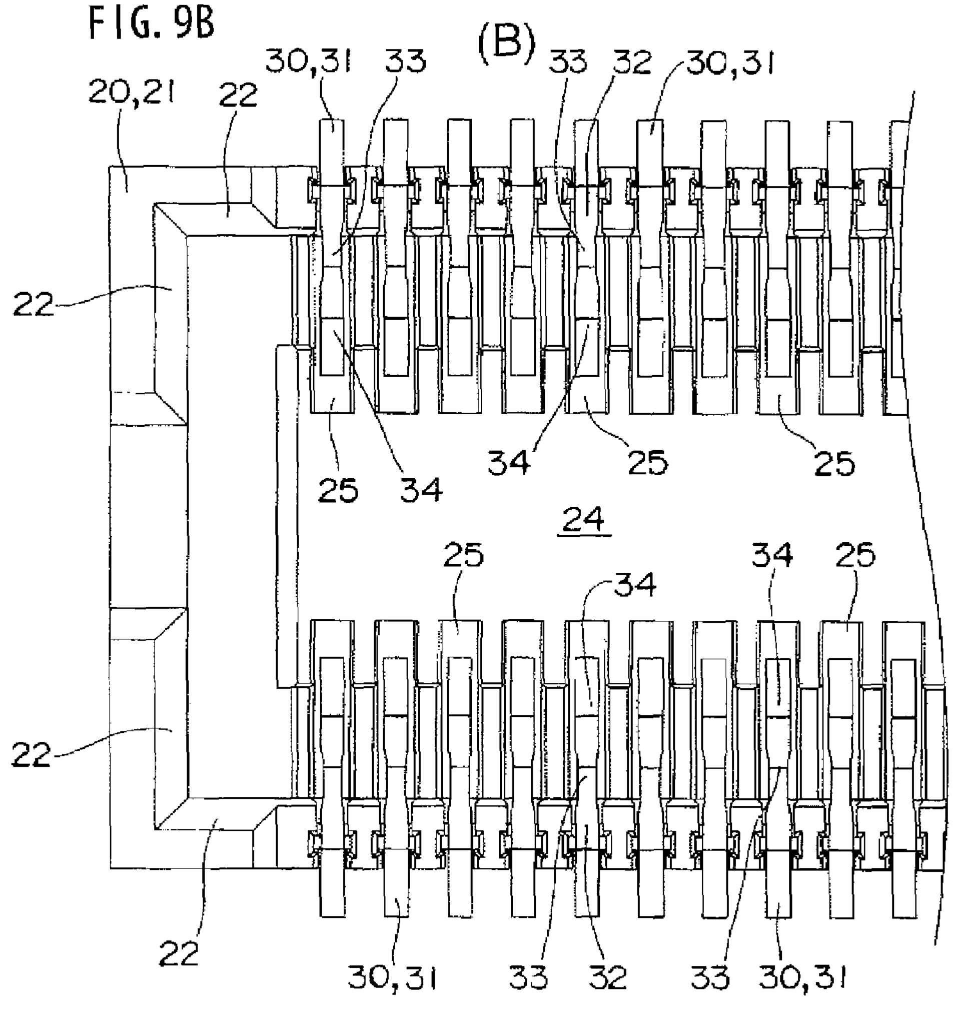

The press-in portion 32 of the first splice 30 is press-fitted in the press-in groove 23 of the socket body 21, whereby the retaining protrusions 35 are latched onto inner side surfaces of the press-in groove 23 to prevent coming off of the first splice 30 (FIG. 9). Because the second contact portion 34 of the first splice 30 is in a loosened state in the fitting groove 25 of the socket body 21, the free end portion of the first slice 30 can elastically be deformed, and can also be rotated by a minute angle. Therefore, even if the component accuracy and assembly accuracy are low of the plug 40, the position can be adjusted by the elastic deformation of the first splice 30. Consequently, according to the present embodiment, higher component accuracy and assembly accuracy are not required of the socket and plug, which facilitates the production and improves a yield.

The first splice 30 is not limited to the above-described embodiment. For example, as shown in FIG. 8, the corner portion of the press-in portion 32 may be formed in a guiding tapered surface 36 (or R-surface) to facilitate the assembly work.

Figure 10A:
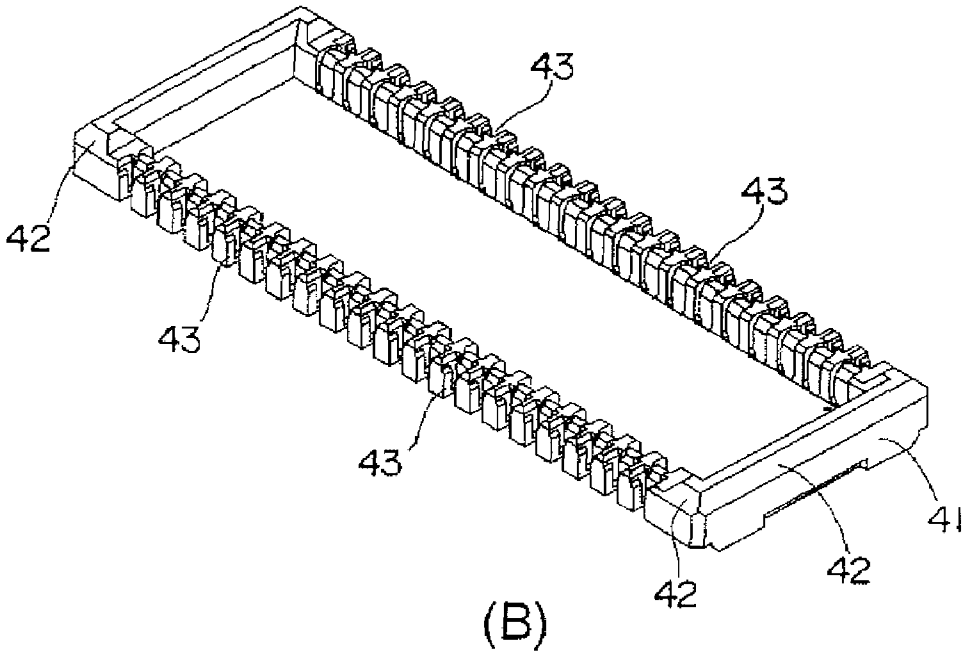
FIGS. 10A and 10B show a perspective view and a partially enlarged plan view of a plug body shown in FIG. 5.
Figure 10B:
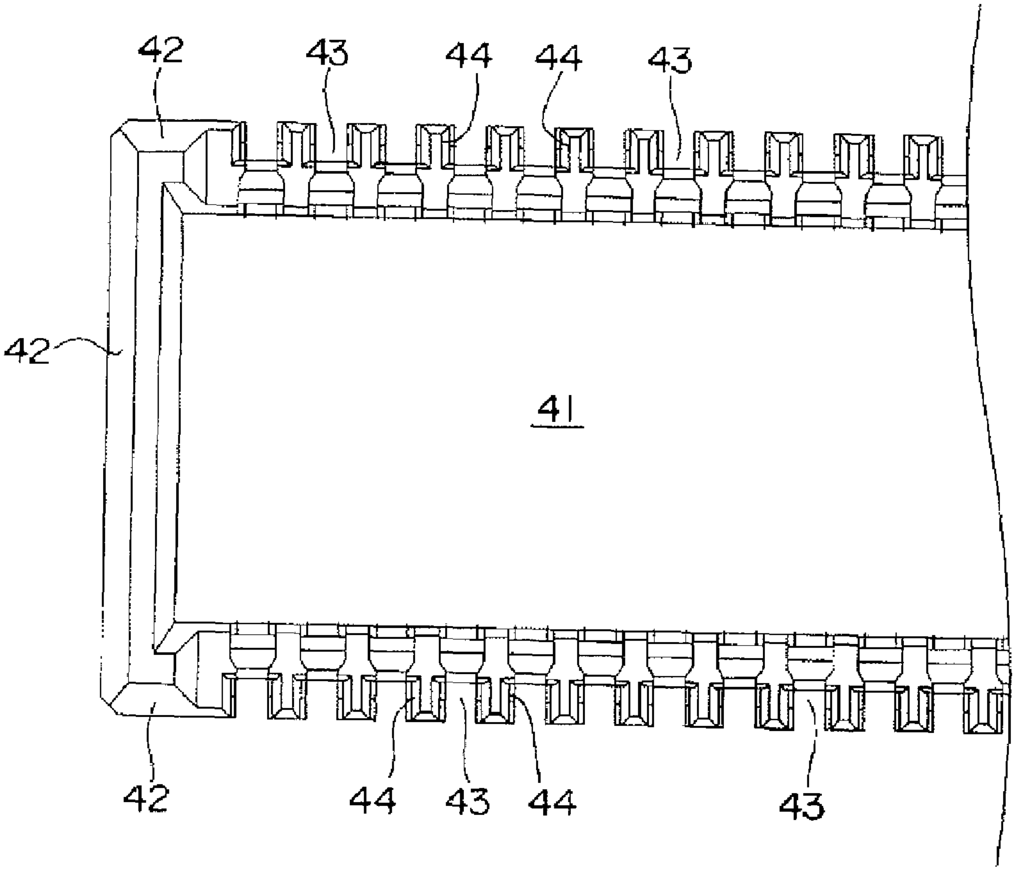
Figure 11A:
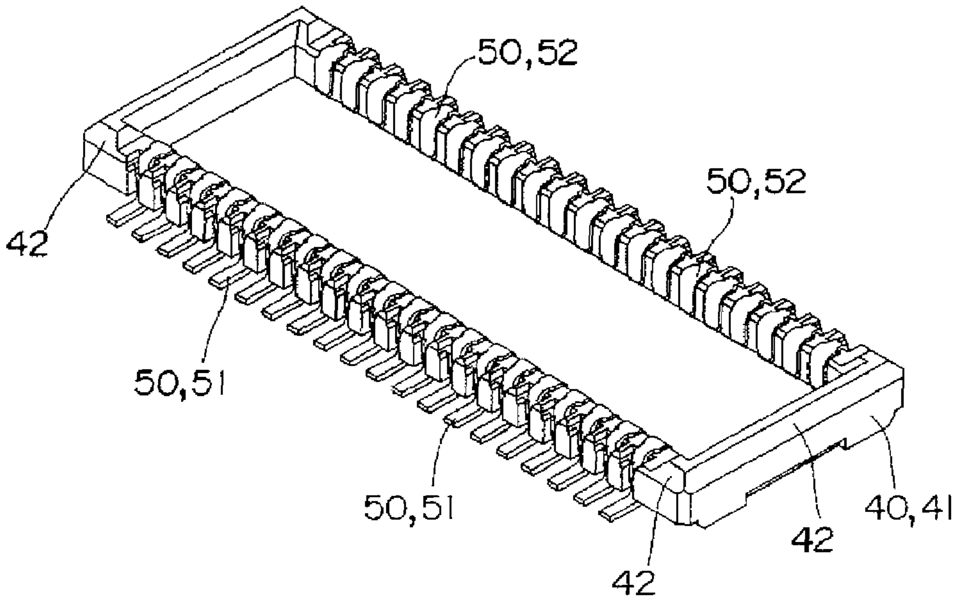
FIGS. 11A and 11B show a perspective view and a partially enlarged plan view illustrating a state in which a second splice is fitted in the plug body.

As shown in FIG. 11, in the plug 40, a plurality of second contacts 50 are provided in parallel along opening edge portions located on opposite sides of a plug body 41. Particularly, as shown in FIG. 10, the plug body 41 has a box shape with a flat shallow bottom, and the plug body 41 can be fitted in the socket body 21. A guiding tapered surface 42 is formed in the outer peripheral surface edge portion of the plug body 41, and press-in grooves 43 are provided in parallel at a predetermined pitch along inner and outer surfaces of sidewalls located on opposite sides. Second contacts 50 to be described later can be press-fitted in the press-in grooves 43. Particularly, guiding notches 44 are formed in lower edge portions of the press-in grooves 43 (FIGS. 10, 12A, 12B, and 13B).

Figure 5:
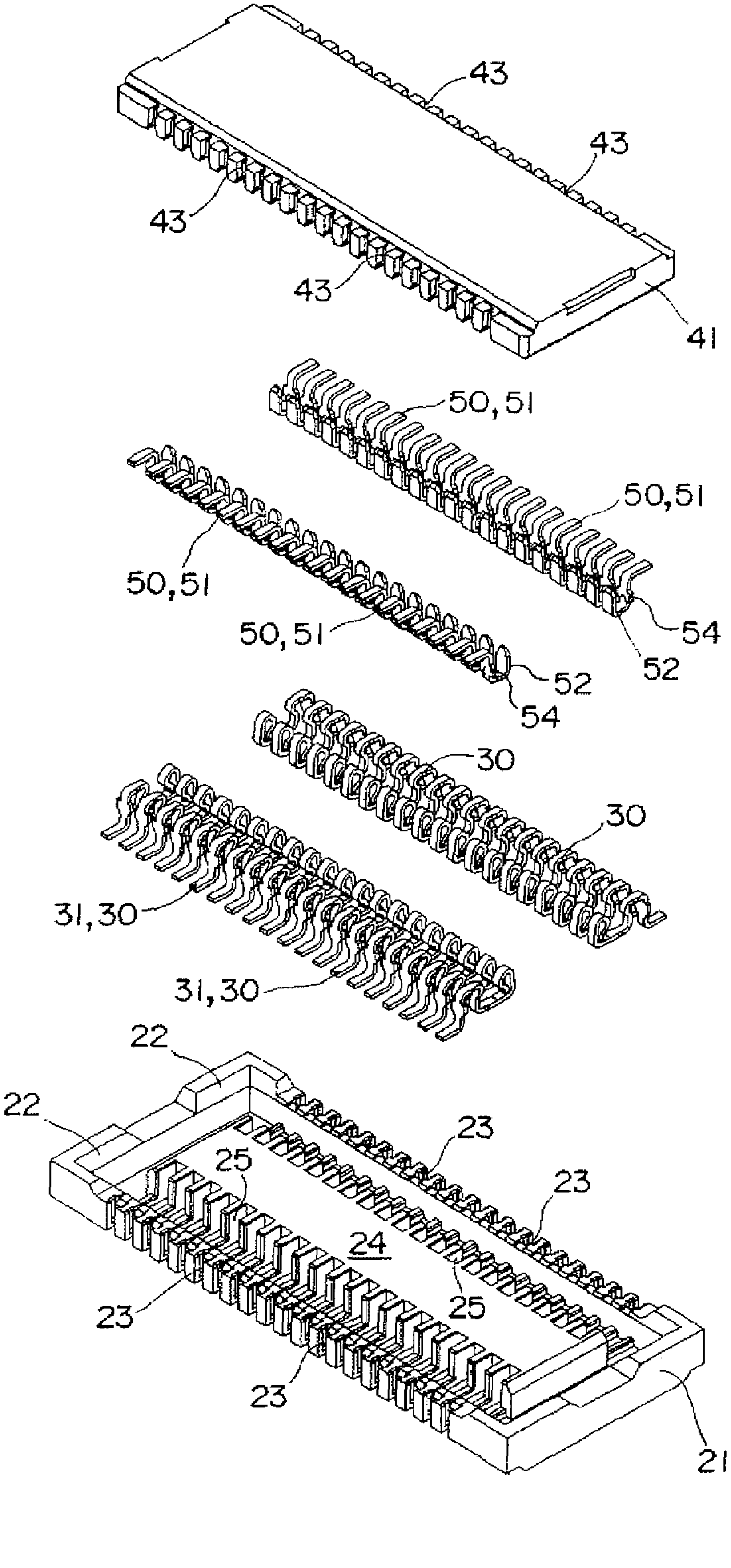
FIG. 5 shows an exploded perspective view of components of the connector shown in FIG. 3.
Figure 11B:
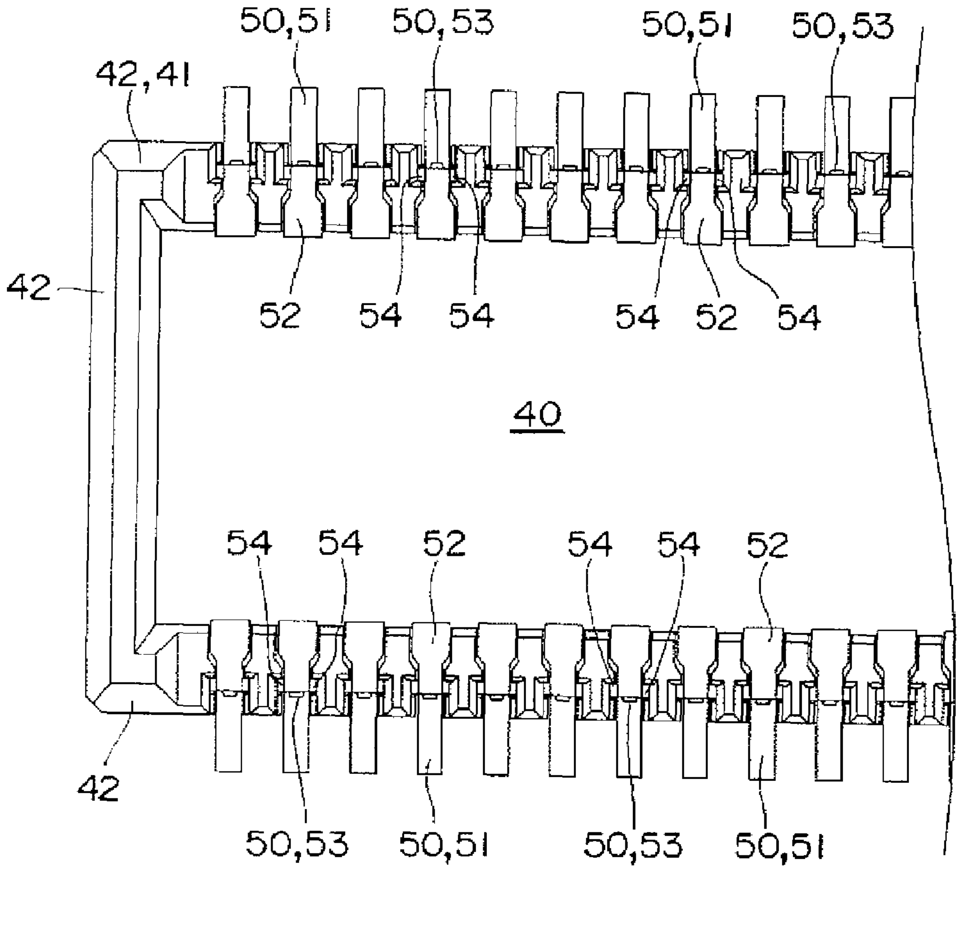
Figure 12A:
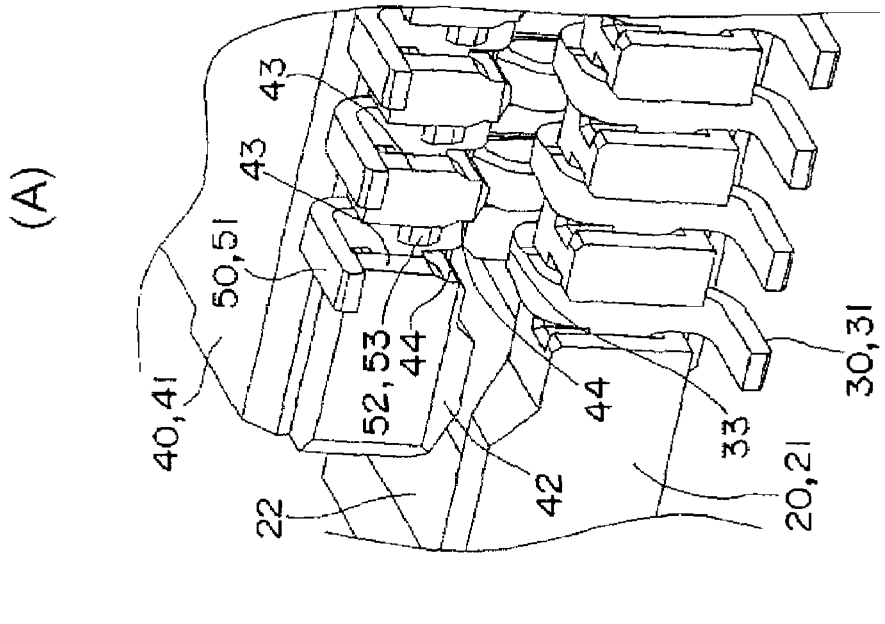
FIGS. 12A to 12C show perspective views illustrating a method of fitting the plug in the socket.
Figure 12B:
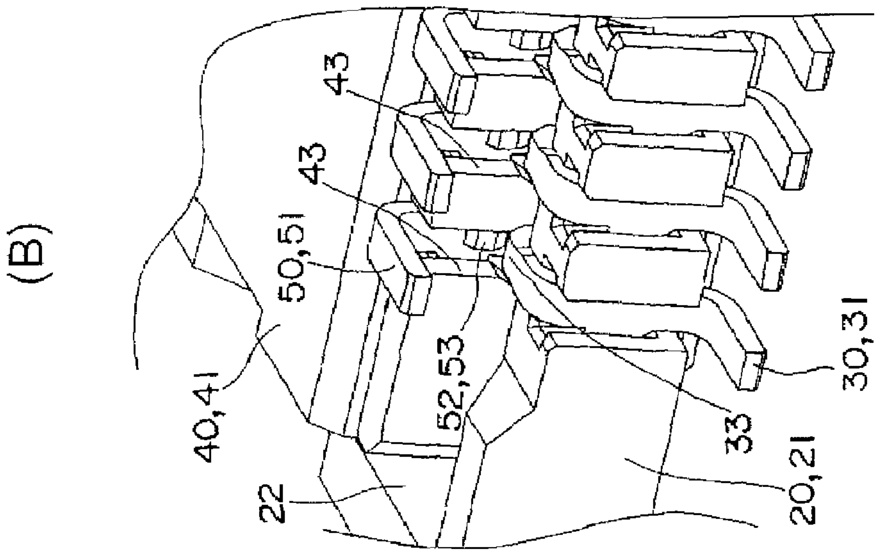
Figure 12C:
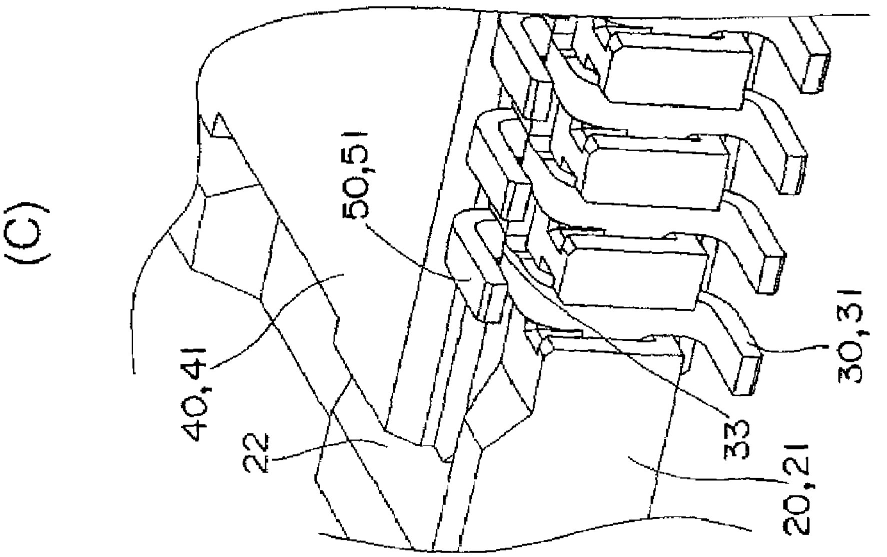

As shown in FIG. 2, the second contact 50, or alternately the second splice 50 has a substantially U-shaped press-in portion 52 which is extended from a wire connection portion 51 and vertically bent. A click-feeling protrusion 53 is provided by protrusion forming on the outside surface on the side of the wire connection portion 51 of the press-in portion 52 (FIGS. 2, 12A, and 12B), and retaining protrusions 54 are provided in both-side edge portions of the outside surface of the second splice 50 (FIGS. 5 and 11B).

The press-in portion 52 of the second splice 50 is press-fitted in the press-in groove 43 of the plug 40, whereby the retaining protrusions 54 are latched onto the inner side surfaces of the press-in groove 43 to prevent the coming off of the second splice 50.

In the case where the socket 20 and the plug 40 are connected, as shown in FIGS. 1 and 2, the plug 40 attached to the lower surface of the printed wiring board 11 is disposed above the socket 20 attached to the upper surface of the printed wiring board 10. The guiding tapered surface 22 provided in the opening edge portion of the socket body 21 is made to abut on the guiding tapered surface 42 provided in the outer peripheral edge portion of the plug body 41, which allows the positioning to be roughly effected. When the plug 40 is lowered, the first contact portion 33 located at the corner portion of the first splice 30 abuts on the guiding notches 44 provided in the press-in groove 43 of the plug 40, and the first contact portion 33 is guided by the guiding notches 44. Therefore, the plug 40 can be positioned more accurately with respect to the socket 20. Then, the press-in portion 52 of the second splice 50 is brought into elastic contact with the first contact portion 33 and second contact portion 34 of the first splice 30 by pushing in the plug 40, and electric conduction is established between the press-in portion 52 and the first contact portion 33 and second contact portion 34.

Figure 13A:
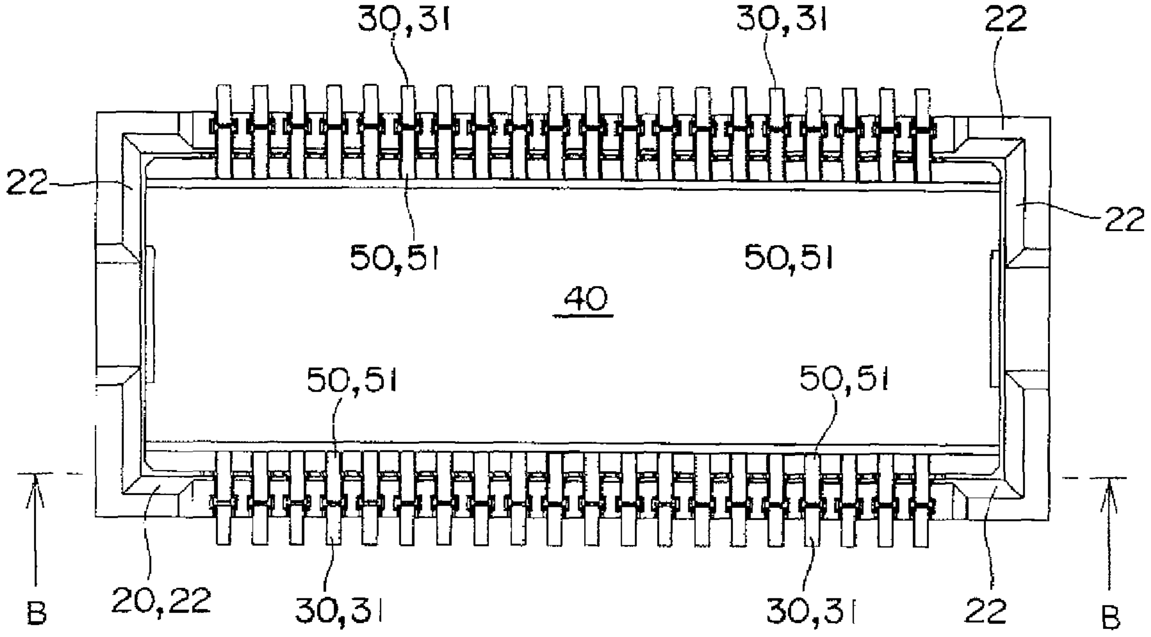
FIG. 13A shows a plan view of the connector for explaining the assembled state.
Figure 13B:
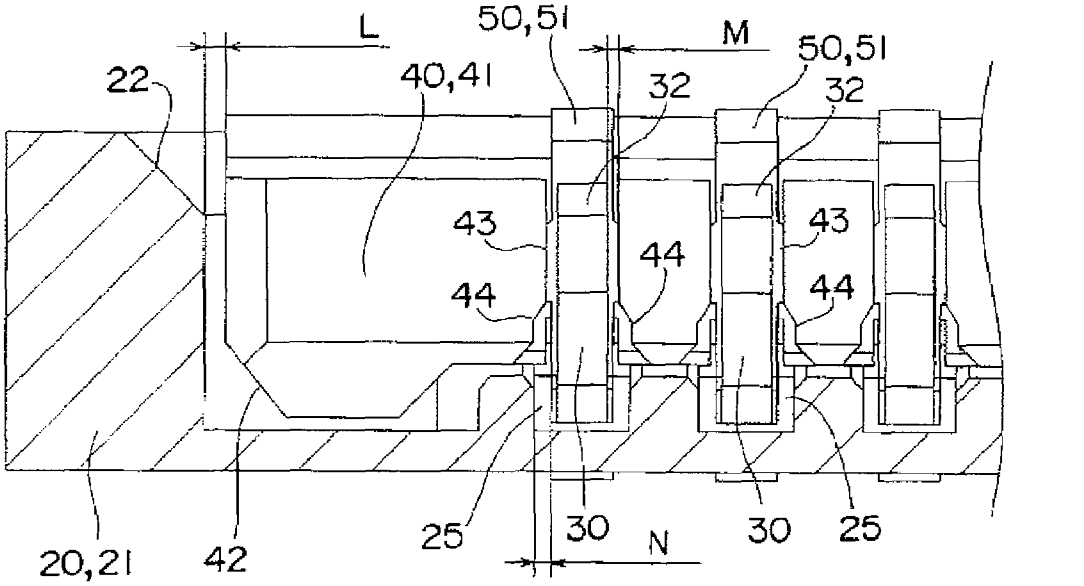
FIG. 13B shows a cross-sectional view taken along a line B-B of FIG. 13A.
Figure 14A:
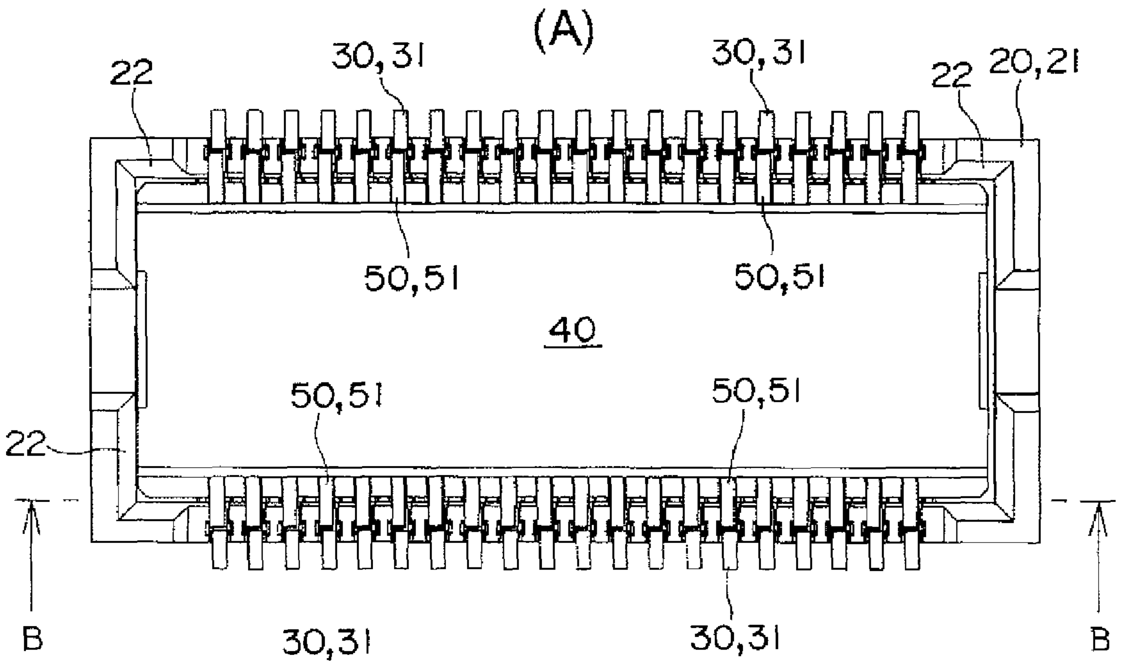
FIG. 14A shows a plan view of the connector for explaining a different assembled state.
Figure 14B:
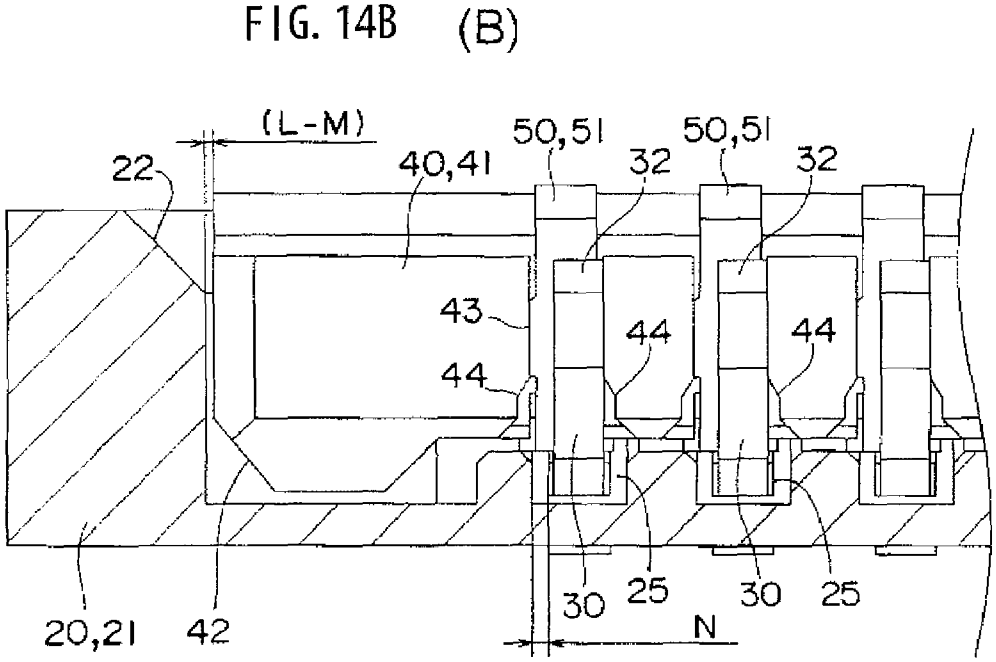
FIG. 14B shows a cross-sectional view taken along a line B-B of FIG. 14A.

According to the present embodiment, as shown in FIG. 13, usually a gap L is generated when the plug 40 is fitted in the socket 20, and a gap M is generated between the first splice 30 fitted in the socket 20 and one side of the press-in groove 43 provided in the plug 40. A relationship of $L>M$ holds. Therefore, even if the plug 40 is shifted by M relative to the socket 20 as shown in FIG. 14, namely, even if the first splice 30 abuts on the inside surface of the press-in groove 43, the plug 40 can be connected to the socket 20 without colliding with the socket 20. Furthermore, the press-in portion 32 of the first splice 30 is press-fitted in the press-in groove 23 provided on the sidewall of the socket body 21, and the free end portion where the first contact portion 34 of the first splice 30 is located can elastically be deformed, so that the first contact portion 34 can be displaced within the fitting groove 25 and brought into elastic contact with the second splice 50. Accordingly, the present embodiment has an advantage that the plug 40 can easily and correctly be connected to the socket 20 even if there is variations in the component accuracy and the assembly accuracy.

According to the present embodiment, because the press-in portion 52 including the click-feeling protrusion 53 is press-fitted between the first and second contact portions 33 and 34, the coming off can be prevented, and the click feeling by which the contact state can be confirmed physically is obtained to give a sense of reassurance to a worker. Additionally, as shown in FIG. 2, because the second contact portion 34 of the first splice 30 outwardly biases the press-in portion 52 of the second splice 50, there is also an advantage that the press-in portion 52 is brought into stronger contact with the first contact portion 33 to improve contact reliability.

The connector according to the present invention is not limited to the case in which the printed wiring boards are connected to each other, but the connector can be applied to the connections of other electric instruments.

What is claimed is:

1. A connector comprising:

a socket in which a plurality of first contacts are provided parallel to an opening edge portion, said plurality of first contacts comprising:

a wire connection portion;

a press-in portion formed to stride over the opening edge portion of the socket, the press-in portion comprising a first hold at an end thereof; and a trough portion extending to a free end thereof formed as a second hold, wherein a first guide portion is provided in at least one of an inside corner portion of the press-in portion and a lower edge portion of a press-in groove; and a plug which has a flat shape capable of fitting in the opening edge portion of the socket, and comprises a plurality of second contacts provided parallel to positions corresponding to the first contacts in the plug, a portion of the plurality of second contacts being configured to be able to be pressed in and retained in the press-in groove between the first hold of the press-in portion and the second hold at the free end of the trough portion such that the first hold and the second hold secure the portion of the plurality of second contacts in the retained state, wherein a second guide portion is provided in at least one of the opening edge portion of the socket and an outer peripheral edge portion of the plug.

2. The connector according to claim 1, wherein:

the press-in portion is press-fitted and retained in the opening edge portion of the socket; and the inside corner portion of the press-in portion is able to be slide-fitted in the press-in groove from a lower side.

3. The connector according to claim 2, wherein:

the free end extending from the trough portion of each of the first contacts provided in parallel in the socket is disposed in a fitting groove provided in the opening edge portion of the socket in an elastically deformable manner.

4. The connector according to claim 1, wherein:

the free end extending from the trough portion of each of the first contacts provided in parallel in the socket is disposed in a fitting groove provided in the opening edge portion of the socket in an elastically deformable manner.

* * * * *